United States Patent [19]

Aso

[11] Patent Number: 4,947,233
[45] Date of Patent: Aug. 7, 1990

[54] SEMI-CUSTOM LSI HAVING INPUT/OUTPUT CELLS

[75] Inventor: Akira Aso, Tokyo, Japan
[73] Assignee: Nec Corporation, Tokyo, Japan
[21] Appl. No.: 113,831
[22] Filed: Oct. 26, 1987

[30] Foreign Application Priority Data

Oct. 24, 1986 [JP] Japan .................. 61-254315

[51] Int. Cl.⁵ ............................. H01L 27/02
[52] U.S. Cl. ...................... 357/65; 357/68; 357/45
[58] Field of Search ............ 357/45, 68, 65

[56] References Cited

U.S. PATENT DOCUMENTS 4,766,475 8/1988 Kawashima ............. 357/42

FOREIGN PATENT DOCUMENTS 57-211248 12/1982 Japan .
59-55045 3/1984 Japan .................. 357/45

Primary Examiner—Andrew J. James
Assistant Examiner—David Saltz
Attorney, Agent, or Firm—Helfgott & Karas

[57] ABSTRACT

A semi-custom LSI formed on a semiconductor chip includes a plurality of basic cells formed in a central portion of the semiconductor chip, a plurality of input-/output cells formed in a peripheral portion of the semiconductor chip, a plurality of bonding pad formed on the input/output cells, and a wiring layer wiring circuit elements in the basic cells and the input/output cells to form a functional circuit and buffers and connecting between the functional circuit, the buffers and the bonding pads, at least one input/output cell having two bonding pads thereon, and one of the two bonding pads being located near an edge of the semiconductor chip, compared to the other.

7 Claims, 2 Drawing Sheets

SEMI-CUSTOM LSI HAVING INPUT/OUTPUT CELLS

BACKGROUND OF THE INVENTION

1. Field of the Invention

The present invention relates to a strucure of semi-custom LSI such as gate array devices and standard cell devices, and more particularly to an improvement of input/output cells in the semi-custom LSI.

2. Description of the Related Art

The gate-array chips or standard-cell chips have a plurality of I/O cells for input and output buffers and a plurality of basic cells used for a circuit construction. The I/O cells and basic cells are made of only circuit elements, to form semi-processed chips applicable to form many kinds of electronic circuits. The semi-processed chips are subjected to wiring process, in accordance with customer's request. Wirings are arbitrarily designed to achieve customer's requested function.

Elements in each I/O cells are wired to form an input or output buffer circuit. One bonding pad is added for respective I/O cells. Therefore, usage of one I/O cell is restricted to one buffer circuit for input or output. Furthermore, since bonding pads are arranged on peripheral portion of the chip to form one line on each side, the maximum number of bonding pads is limited by the used chip size, resulated in a limited number of input and output signals. The number of input and output signals may be increased by expanding chip size. This measurement is, however, retrogressive against the present trend of miniaturization and cost-reduction.

SUMMARY OF THE INVENTION

The primary object of the present invention is to provide a semi-custom LSI including a plurality of basic cells and a plurality of I/O cells, which is accessible to an increased number of input and output signals without increasing chip size.

In accordance with the present invention, there is provided a semiconductor device comprising a semiconductor chip, a plurality of basic cells including circuit elements usable for circuit construction, a plurality of input/output cells including circuit elements usable for forming input and output buffers, wiring layers wiring the circuit elements in the basic cells and the input/output cells to form functional circuit and input and output-buffers, and a plurality of bonding pads connected by means of said wiring layers to the input and output buffers such that two bonding pads are connected to the input and/or output circuits formed with the circuit elements in one input/output cell and such that the bonding pads are arranged in two lines on peripheral surface portion at each side of the semiconductor chip. Preferably, the two bonding pads are formed on the input/output cell by which input and/or output circuits connected to the two bonding pads are formed, one of the two bonding pads being located inside and the other being outside.

The semiconductor device of the present invention has two bonding pads for each input/output cell. This structure allows to form two buffers among input, output and bidirectional buffers by one input/output cell, causing an increasing in number of accessible input and output signals.

Furthermore, those two bonding pads are arranged in two lines along each side edge of the chip. This structure does not require any extended peripheral length of the semiconductor chip, irrespective of increased number of bonding pads.

BRIEF DESCRIPTION OF THE DRAWINGS

The above and further objects, features and advantages of the present invention will become more apparent from the following detailed description taken in conjunction with the accompanying drawings, wherein.

Figure 1:
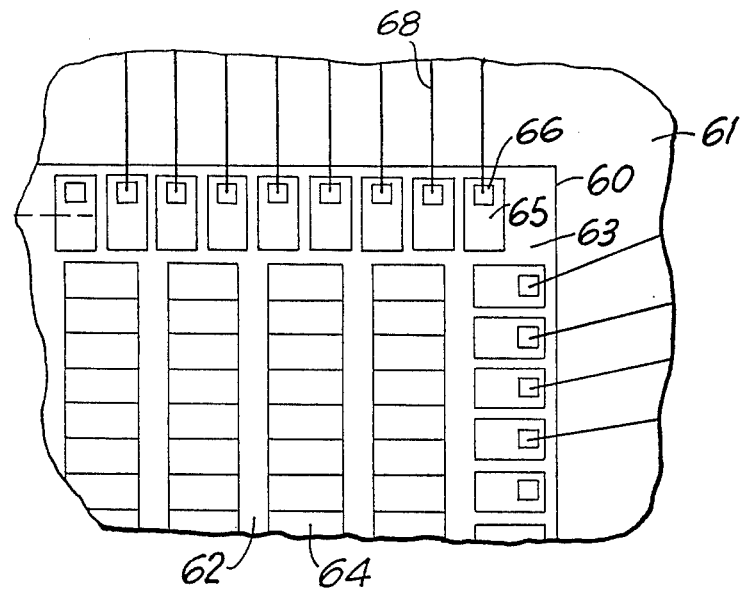
FIG. 1 is a partial plan view of a semiconductor integrated circuit mounted on a mounting area of a package, in the prior art.

In the prior art, a semiconductor chip 60 has a plurality of basic cells 64 in a logic circuit area 62 and a plurality of input/output cells 65 in a peripheral buffer area 63, as shown in FIG. 1. Input/output cells 65 are disposed in lines at periphery of the semiconductor chip 60. Each input/output cell 65 has one bonding pad 66. The semiconductor chip 60 is mounted on a mounting area 61 of package having a plurality of external leads. Each bonding pad 66 is connected to one of the external leads by a fine metal wire 68.

Since only one bonding pad 66 is formed on one input/output cell 65, total number of accessible signals is limited to the number of input/output cells 65 which depends on the peripheral length of the semiconductor chip 60. Therefore, in order to increase the number of input and output signals accessible to the integrated circuit, increment of chip size is required. This enlargement of chip size accompanies many drawbacks such as a rise in cost and a deteriorated yield.

DESCRIPTION OF PREFERRED EMBODIMENTS

Figure 2:
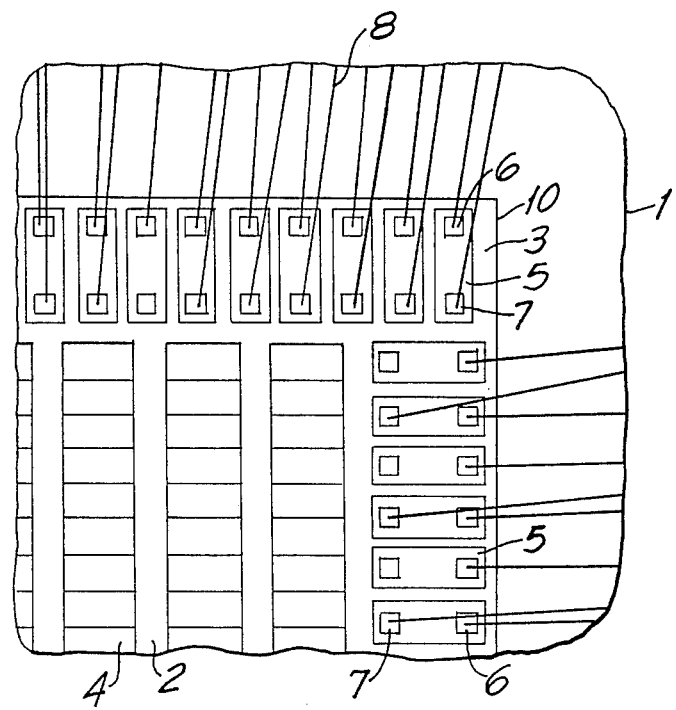
FIG. 2 is a partial plan view of a semiconductor integrated circuit mounted on a mounting area of a package in accordance with a first preferred embodiment of the present invention.

The first preferred embodiment of the present invention shown in FIGS. 1 and 2 has lines of input/output buffers 5 on a peripheral area 3 at each side of a semiconductor chip 10, similar to the conventional semiconductor chip 60. A plurality of basic cells 4 are disposed on a logic circuit area 2 surrounded by the peripheral area 3. Each input/output cell 5 has two bonding pads 6 and 7, one being disposed inside compared to the other to form two parallel lines on one side of the semiconductor chip 10. The semiconductor chip 10 is mounted on a mounting area 1 of a package which has a plurality of external leads. Each bonding pads 6 and 7 are connected to one of the external leads by a fine metal wire 8.

The basic cells 4 have a plurality of circuit elements which are wired to form appropriate logic circuit in accordance with customer's request. Simultaneously with the formation of logic circuits, the logic circuits of respective basic cells 4 are connected to form a functional circuit.

Figure 3:
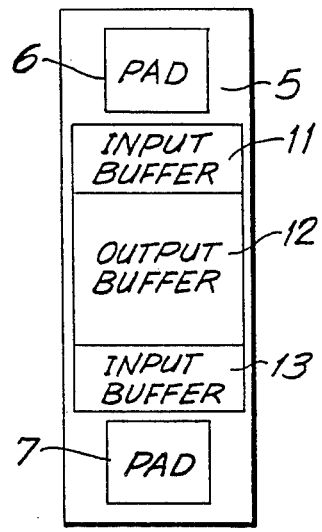
FIG. 3 is a plan view of an input/output cell usable in the first preferred embodiment shown in FIG. 2.

The input/output cells 5 are shown in more detail in FIG. 3 and have a plurality of circuit elements usable for forming input, output and bidirectional buffers. The circuit elements for input buffers are formed in input buffer regions 11 and 13. The circuit elements for an output buffer are formed in an output buffer region 12. In accordance with necessity, two input buffers, respective one input and output buffers or one input and one bidirectional buffers are formed by wiring elements in the buffer regions 11, 12 and 13 together with a formation of two bonding pads 6 and 7. One of formed buffers is connected to one of the bonding pads 6 and 7, the other buffer being connected to the other bonding pad. The bidirectional buffer is a combination of an input buffer and an output buffer and a connection of a bonding pad to an output portion of the output buffer and an input portion of the input buffer. It is needless to say that the wirings of the input/output cells 5 are simultaneously formed with the wirings of the basic cells 4. Un-wired semiconductor chips are formed, in advance, and stocked for customer's request. The concrete circuit formation is determined by the customer's request.

As above-mentioned, the input/output cells 5 may form two independent buffers. When a large number of input signals are required to be inputted, the numbers of input buffers and bidirectional buffers may be increased. On the contrary, a large number of output signals are required to be outputted, the numbers of output buffers and bidirectional buffers may be increased. In accordance with the required input/output condition, the numbers of input buffers, output buffers and bidirectional buffers may be changeable.

Furthermore, the first preferred embodiment disposes one bonding pad 6 near the edge of the semiconductor chip 10 and the other 7 near the logic circuit are 2. That is, the bonding pads 6 and 7 are arranged two lines in parallel with the edge of the semiconductor chip 10. Therefore, irrespective of double number of bonding pads compared to the conventional integrated circuit device, the semiconductor chip 10 of the first preferred embodiment does not require the extended peripheral length or expanded chip size. The device does not require an increased cost. Production yield is not deteriorated.

Figure 4:
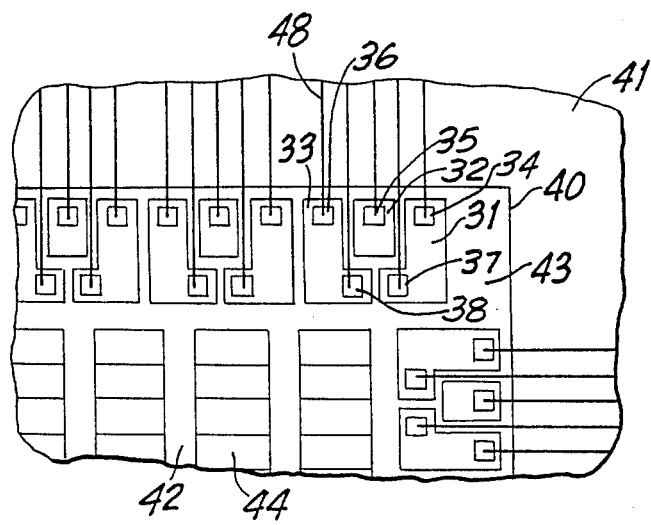
FIG. 4 is a partial plan view of a semiconductor integrated circuit mounted on a mounting area of a package in accordance with a second preferred embodiment of the present invention.

The second preferred embodiment of the present invention shown in FIG. 4 has a plurality of sets of buffer cells 31, 32 and 33 on a peripheral area 43 and a plurality of basic cells 44 on a logic circuit area 42. Each set of buffer cells is composed of a rectangular buffer cell 32 and two cranked figure buffer cells 31 and 33. The rectangular buffer cell 32 has one bonding pad 35. The cranked figure buffer cells 31 and 34 have bonding pads 34 and 36 near the edge of the semiconductor chip 40 and other bonding pads 37 and 38 near the logic circuit area 42. The semiconductor chip 40 is mounted on a mounting area 41 of a package having a plurality of external leads. The bonding pads 34 to 38 are respectively wired to the external leads by fine metal wires 48.

A single function input/output cell 32 has one bonding pad 35 and has a small area. On the other hand, multi-function input/output cells 31 and 33 have two bonding pads 34 and 37 and 36 and 38 and occupy an area necessary for two or more buffers. For efficient use of chip area, the input/output cells 31 and 33 are cranked so as to enclose the single function input/output cell 32.

Although the present invention has been explained by using examples of gate array devices, the present invention may be equally applicable to standard cell devices or other devices having a plurality of input/outpu cells on a periphery of semiconductor chip. Among two bonding pads, unused bonding pad may be leaved without bonding wire or alternatively removed without formation thereof.

What is claimed is:

1. A semiconductor integrated circuit comprising:
a semiconductor chip;
a functional circuit formed in a central portion of said semiconductor chip;
a plurality of input/output cells formed on a peripheral portion of said semiconductor chip and including at least one buffer selected from input, output and input/output buffers; and
conductive layers wiring said circuit elements to form input and/or output buffers and forming a plurality of bonding pads, connection paths between said bonding pads and said input and/or output buffers and electrical connection between said input and/or output buffers and said functional circuit, two bonding pads being formed on each of selected ones of said input/output cells for external connection thereof, and one of said two bonding pads on each of said selected input/output cells being disposed between a respective edge of said semiconductor chip and said buffer and the other of said two bonding pads on each of said selected input/output cells being disclosed between said buffer and said functional circuit so as to form two lines of said bonding pads along each edge of said semiconductor chip as a whole.

2. A semiconductor integrated circuit as claimed in claim 1, wherein said functional circuit is formed by wiring a plurality of logic circuits which are formed by using a plurality of basic cells, said basic cells respectively including a plurality of circuit elements and said logic circuits being formed by wiring said circuit elements.

3. A semiconductor integrated circuit comprising:
a semiconductor chip having four side edges;
a plurality of basic cells having a plurality of circuit elements formed for constructing a logic circuit, said basic cells being formed in a central portion of said semiconductor chip;
a plurality of input/output cells having a plurality of circuit elements formed for constructing buffers; said input/output cells being formed in a peripheral portion of said semiconductor chip;
a plurality of bonding pads formed on said input/output cells for external connection thereof, at least one of said input/output cells having two of said bonding pads thereon, respectively, one of said two bonding pads being located closer to said side edges of said semiconductor chip with respect to said buffers and being aligned in a line with the bonding pads on said input/output cells except for said at least one of said input/output cell and the other of said two bonding pads being located inside said semiconductor chip with respect to said buffers; and
a wiring layer wiring said circuit elements in said basic cells to form a functional circuit, wiring said circuit elements in said input/output cells to form a buffer selected from an input buffer, an output buffer and a bidirectional buffer, connecting said functional circuit to said buffers and connecting said buffers to said bonding pads.

4. A semiconductor integrated circuit as claimed in claim 3, wherein said at least one of said input/output cells having first and second groups of circuit elements for constructing said input buffer and third group of circuit elements of constructing said output buffer.

5. A semiconductor integrated circuit comprising:
a semiconductor chip having four side edges;
a plurality of basic cells having a plurality of circuit elements formed for constructing a logic circuit, said basic cells being formed in a central portion of said semiconductor chip;
a plurality of input/output cells having a plurality of circuit elements formed for constructing buffers; said input/output cells being formed in a peripheral portion of said semiconductor chip;
a plurality of bonding pads formed on said input/output cells, at least one of said input/output cells having two of said bonding pads thereon, respectively, one of said two bonding pads being located closer to said side edges of said semiconductor chip with respect to said buffers and being aligned in a line with the bonding pads on said input/output cells except for said at least one of said input/output cell and the other of said two bonding pads being located inside said semiconductor chip with respect to said buffers; and
a wiring layer wiring said circuit elements in said basic cells to form a functional circuit, wiring said circuit elements in said input/output cells to form a buffer selected from an input buffer, an output buffer and a bidirectional buffer, connecting said functional circuit to said buffers and connecting said buffers to said bonding pads, wherein said input/output cells includes cells of a first type having circuit elements for constructing one of said buffers and cells of a second type having circuit elements for constructing two or more of said buffers, said cells of said second type having two bonding pads thereon and cranked figure enclosing said cell of said first type.

6. A semiconductor integrated circuit comprising:
a semiconductor chip having four side edges;
a plurality of basic cells having a plurality of circuit elements formed for constructing a logic circuit, said basic cells being formed in a central portion of said semiconductor chip;
a plurality of input/output cells having a plurality of circuit elements formed for constructing buffers, said input/output cells being formed in a peripheral portion of said semiconductor chip;
a plurality of bonding pads formed on said input/output cells for external connection thereof, at least one of said input/output cells having two of said bonding pads thereon, respectively, one of said two bonding pads being located closer to said side edges of said semiconductor chip with respect to said buffers and being aligned in a line with bonding pads on said input/output cells except for said at least one of said input/output cell and the other of said two bonding pads being located inside said semiconductor chip with respect to said buffers; and
a wiring layer wiring said circuit elements in said basic cells to form a functional circuit, wiring said circuit elements in said input/output cells to form a buffer selected from an input buffer, an output buffer and a bidirectional buffer, connecting said functional circuit to said buffers and connecting said buffers to said bonding pads, said at least one of said input/output cells having first and second groups of circuit elements for constructing said input buffer and a third group of circuit elements for constructing said output buffer.

7. A semiconductor integrated circuit comprising:
a semiconductor chip having four side edges;
a plurality of basic cells having a plurality of circuit elements formed for constructing a logic circuit, said basic cells being formed in a central portion of said semiconductor chip;
a plurality of input/output cells having a plurality of circuit elements formed for constructing buffers, said input/output cells being formed in a peripheral portion of said semiconductor chip;
a plurality of bonding pads formed on said input/output cells, at least one of said input/output cells having two of said bonding pads thereon, respectively, one of said two bonding pads being located closer to said side edges of said semiconductor chip with respect to said buffers and being aligned in a line with bonding pads on said input/output cells except for said at least one of said input/output cell and the other of said two bonding pads being located inside said semiconductor chip with respect to said buffers; and
a wiring layer wiring said circuit elements in said basic cells to form a functional circuit, wiring said circuit elements in said input/output cells to form a buffer selected from an input buffer, an output buffer and a bidirectional buffer, connecting said functional circuit to said buffers and connecting said buffers to said bonding pads, said input/output cells includes cells of a first type having a circuit elements for constructing one of said buffers and cells of a second type having circuit elements for constructing two or more of said buffers, said cells of said second type having two bonding pads thereon and cranked figure enclosing said cell of said first type.

* * * * *